(12) United States Patent
Dutton

(10) Patent No.: US 7,290,326 B2
(45) Date of Patent: Nov. 6, 2007

(54) METHOD AND APPARATUS FOR FORMING MULTI-LAYERED CIRCUITS USING LIQUID CRYSTALLINE POLYMERS

(75) Inventor: Steven Lee Dutton, Phoenix, AZ (US)

(73) Assignee: Dynaco Corp., Tempe, AZ (US)

( * ) Notice: Subject to any disclaimer, the term of this patent is extended or adjusted under 35 U.S.C. 154(b) by 87 days.

(21) Appl. No.: 11/187,220

(22) Filed: Jul. 22, 2005

(65) Prior Publication Data

US 2007/0017092 A1 Jan. 25, 2007

(51) Int. Cl.
    *B23P 19/00* (2006.01)
(52) U.S. Cl. .............................. 29/738; 29/739; 29/830
(58) Field of Classification Search .................. 29/825, 29/830, 832, 738, 739
See application file for complete search history.

(56) References Cited

U.S. PATENT DOCUMENTS

| | | | |
|---|---|---|---|
| 3,219,749 A * | 11/1965 | Schuster et al. ............ 174/266 |
| 3,344,515 A * | 10/1967 | Schuster et al. .............. 29/852 |
| 5,719,354 A | 2/1998 | Jester et al. |
| 6,043,990 A | 3/2000 | Johnson et al. |
| 6,215,320 B1 | 4/2001 | Parrish |
| 6,290,860 B1 | 9/2001 | Appelt et al. |
| 6,391,210 B2 | 5/2002 | Appelt et al. |
| 6,826,830 B2 | 12/2004 | Egitto et al. |
| 6,900,708 B2 | 5/2005 | White et al. |
| 2002/0064701 A1 | 5/2002 | Hand et al. |
| 2003/0118836 A1 | 6/2003 | Lee et al. |
| 2005/0057908 A1 | 3/2005 | Egitto et al. |

* cited by examiner

*Primary Examiner*—Carl J. Arbes
(74) *Attorney, Agent, or Firm*—Snell & Wilmer L.L.P.

(57) ABSTRACT

A method and apparatus for producing high layer count, multi-layer circuits which includes fabricating a fixture having an opening therein for placement within a press. A material stack, particularly a material stack having multiple layers of liquid crystalline polymer, is placed within the opening of the fixture before activating the press to laminate the material stack positioned within the fixture.

12 Claims, 9 Drawing Sheets

D – PRODUCT STACK
C – ALUMINUM FIXTURE
B – CAUL PLATE
A – PRESS PLATEN

BEFORE PRESS

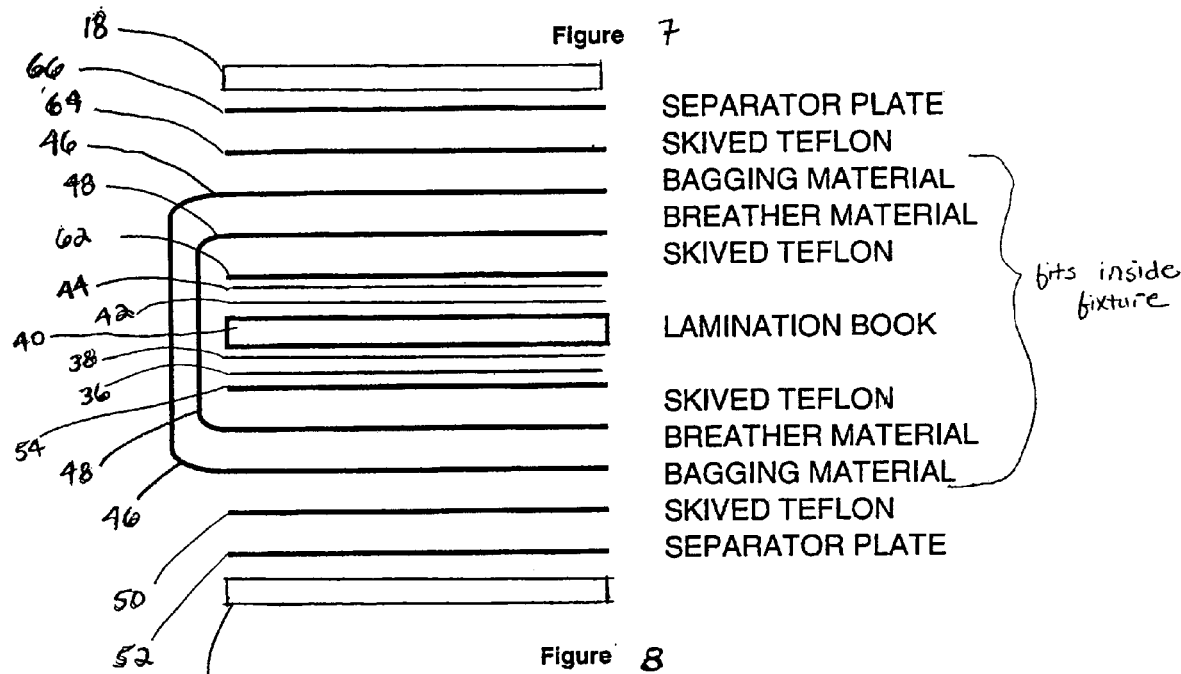
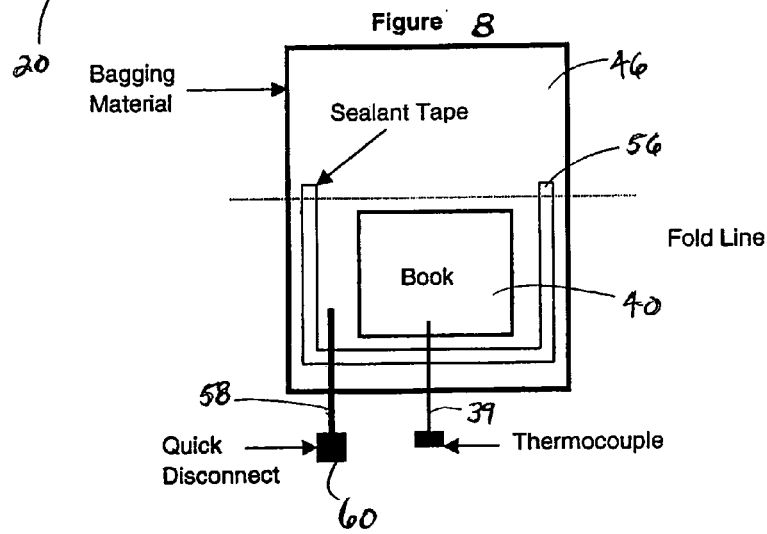

METHOD AND APPARATUS FOR FORMING MULTI-LAYERED CIRCUITS USING LIQUID CRYSTALLINE POLYMERS

FIELD OF INVENTION

This invention relates, generally, to a method and apparatus for forming multi-layered circuits and, in particular, to a method and apparatus for forming high layer count circuits comprising liquid crystalline polymer insulating or dielectric layers.

BACKGROUND OF THE INVENTION

Multi-layered circuit boards are typically fabricated from layers of distinct circuit patterns separated by insulating material such as thin dielectric layers and interconnected by vias, or holes, that are drilled through the circuit board and plated with metal. It is desirable to interconnect integrated circuit packages and discrete electronic devices in highly dense assemblies to reduce signal paths and overall size.

However, the number of layers comprising multi-layered circuit boards becomes limited due to the increased non-uniformity in thickness and high fluid flow as more layers are added. During the processing of some exemplary circuit boards, layers of liquid crystalline polymer with copper on both sides are stacked up and then laminated together using a mechanical/electrical press, a mechanical hot oil press, or a mechanical hot steam press. Vias are then made by drilling holes in the multi-layered board and the interior surface of the vias are plated with metal to connect the distinct circuit patterns of the different layers. When the multilayer stack produces more liquid when being pressed into a laminated package, features or circuit tracers can shift and, as a result, not line up. In addition, when pressure and heat are applied to the multi-layer stack by the mechanical/electrical press, more pressure gets applied to the center of the multi-layer stack than the outer perimeter of the stack. This non-uniform pressure distribution results in a multi-layer stack having a non-uniform thickness and conductor layer feature shifting. In addition, it becomes difficult to drill and plate the interior surfaces of the vias within the non-uniformity of the multi-layer stack. This non-uniformity also becomes a performance issue at high frequencies.

Controlling or limiting the pressure applied to the multi-layer stack during the lamination cycle would decrease shifting of the layer features and would enable the production of a multi-layer stack having a precise uniform thickness. A multi-layer stack having reduced feature shifting and a uniform thickness enables more precise processing for the remaining processing steps including the creation of vias within the multi-layer stack having more uniform depths and diameters and, as a result, more uniform plating of the interior of the vias.

Current methods for fabricating multi-layer stacks of liquid crystalline polymers with copper foil are not capable of limiting feature shifting in the various layers and/or controlling or limiting the pressure applied to the multi-layer stacks during lamination. As a result, the number of layers that can be laminated to form a multi-layer circuit is limited in order to avoid feature shifting and non-uniformity in the thickness of the multi-layer stack.

Accordingly, there is a need for a method and apparatus for producing a high layer count, multi-layer circuit board having reduced feature shifting and a uniform thickness in order to provide a structure for supporting and interconnecting a high density of electronic devices.

SUMMARY OF THE INVENTION

In general, the present invention provides a method and apparatus for forming high layer count, multi-layered circuits. The present invention is particularly useful for forming high layer count, multi-layered circuits comprising liquid crystalline polymer layers. The method and apparatus of the present invention function to control and/or limit the pressure applied to a multi-layer material (product) stack during lamination while fabricating multi-layer circuits.

In accordance with one aspect of the present invention, an apparatus for forming multi-layered circuits is provided which includes a press having top and bottom platens capable of applying pressure to a material stack located between the platens and a fixture positioned between the platens having an opening therein in which to position the material stack. The fixture functions to limit or control the pressure applied to the material stack which in turn results in a laminated material stack having a uniform thickness.

In accordance with a further aspect of the invention, a top caul plate is positioned between the top platen and the fixture and a bottom caul plate is positioned between the bottom platen and the fixture. In addition, a top separator plate may be positioned between the top caul plate and the fixture and a bottom separator plate may be positioned between the bottom caul plate and the fixture.

In accordance with yet a further aspect of the invention, the material stack may be enclosed so that a vacuum can be applied to the bag during lamination. Other means of vacuum such as an enclosed vacuum press will work as well. A thermocouple is inserted into the material stack before the vacuum is applied and before lamination. A number of release sheets and other materials may be used to enclose the material stack. In one exemplary embodiment of enclosing the material stack, a first release sheet is positioned on top of the bottom separator plate, a bagging material is positioned on top of the first release sheet, a breather material is positioned on top of the bagging material, a second release sheet is positioned between the breather material and the fixture containing a material stack, a sealant tape is applied around at least half of the perimeter of the bagging material and underneath and around the thermocouple and also around copper tubing positioned along the perimeter of the bagging material where the copper tubing is connected to a disconnect, a third release sheet is positioned on top of the material stack, and half of the perimeter of the bagging material is folded over the sealant tape and pressure is applied to the sealant tape to seal the bagging material thereby producing a vacuum enclosure containing the breather material, the fixture, and the material stack.

In accordance with yet a further aspect of the present invention, at least one pin may be inserted into the fixture to hold the fixture in place during lamination of the material stack.

The present invention also provides a method for forming multi-layered circuits which includes the steps of providing a press having top and bottom platens, positioning a fixture having an opening therein between the top and bottom platens, positioning a material stack within the opening in the fixture, and applying pressure to the material stack by applying pressure to the top and bottom platens.

In accordance with a further aspect of the method of the present invention, the step of positioning a fixture having an opening therein includes the step of first creating the fixture so that it has an opening with a desired shape, size, and depth depending upon the end lamination product. The method of the present invention may also include the step of placing the fixture and the material stack within a vacuum enclosure and applying a vacuum to the vacuum enclosure before the step of applying pressure to the material stack.

In accordance with yet another aspect of the method of the present invention, heat may be applied to the top and bottom platens during the step of applying pressure to the material stack. In addition, the method may include positioning a top caul plate between the top platen and the fixture and a bottom caul plate between the bottom platen and the fixture. The method of the present invention may also include positioning a top separator plate between the top caul plate and the fixture and a bottom separator plate between the bottom caul plate and the fixture.

In accordance with still a further aspect of the invention, a fixture is provided for placement between top and bottom platens in a press where the fixture includes an opening in which to position a material stack for lamination. The fixture may also include a slot connecting the opening in the fixture to the exterior of the fixture so that the slot can retain connection means for connecting the material stack to a thermocouple.

BRIEF DESCRIPTION OF THE DRAWINGS

The present invention will hereinafter be described in conjunction with the appended drawing figures, wherein like numerals denote like elements, and:

FIG. 7 is a cross-sectional schematic showing an exemplary embodiment of a portion of the apparatus of the present invention;

FIG. 8 is a schematic showing an exemplary embodiment of the present invention in which the fixture and material stack are enclosed within a vacuum bag prior to applying pressure to the material stack;

DETAILED DESCRIPTION

Methods and apparatus in accordance with the present invention generally provide a method and apparatus for forming high layer count multi-layered circuits comprising liquid crystalline polymer (LCP) insulating layers where there is minimal feature shifting of the layers and uniform thickness of the high layer count multi-layer circuit. The subject invention is specifically directed to a press having top and bottom platens capable of applying pressure to a material stack located between the platens and a fixture positioned between the platens where the fixture contains an opening in which to position the material stack before applying pressure. It should be understood by those skilled in the art that any type of press may be used in accordance with the invention. For example, the press may be a mechanical/electrical press, a mechanical hot oil press, a mechanical hot steam press, or any other type of press that is capable of applying pressure to a material stack.

Figure 2:
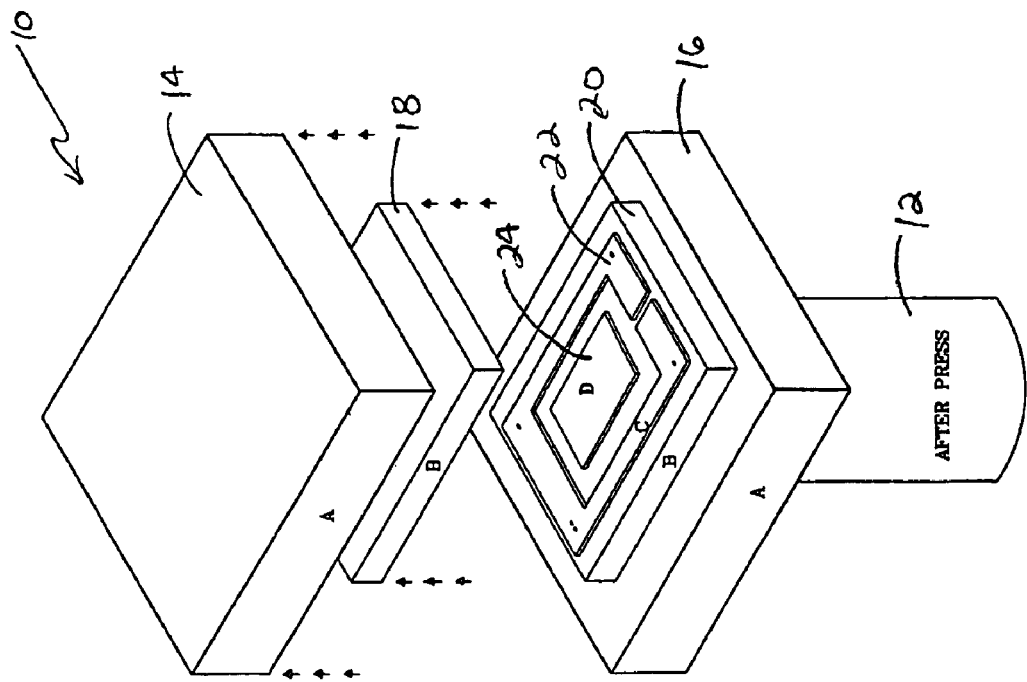
FIG. 2 is a perspective view of the apparatus of the present invention for forming multi-layer circuits after applying pressure to the material stack.
Figure 1:
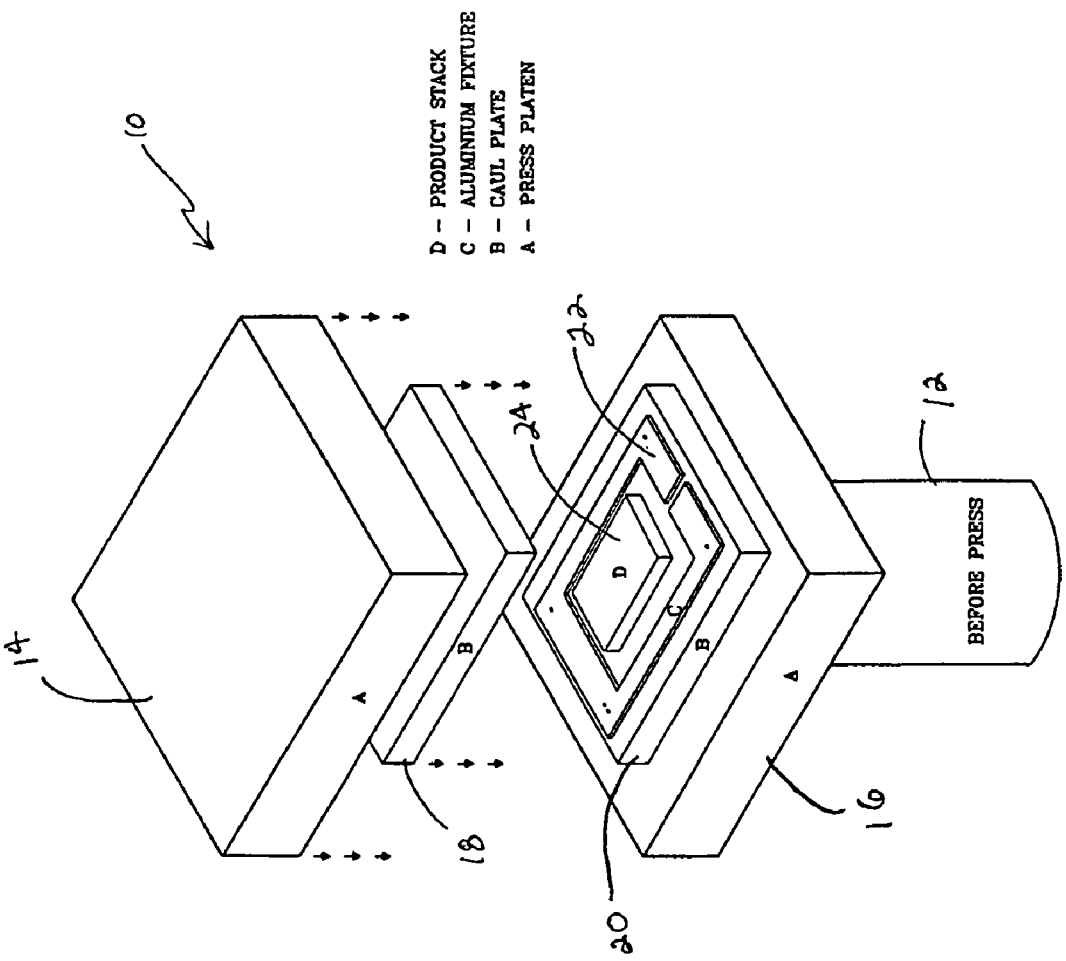
FIG. 1 is a perspective view of the apparatus of the present invention for forming multi-layer circuits before applying pressure to the material stack.

FIGS. 1 and 2 show perspective views of an exemplary embodiment of the apparatus 10 of the present invention for forming high count multi-layer circuits both before and after the apparatus is used to apply pressure to a material stack, i.e. a stack of liquid crystalline polymer insulating layers each having patterned circuit features in the attached conductive foil contained thereon. Apparatus 10 generally includes a press 12 having a top platen 14 and a bottom platen 16, a top caul plate 18, a bottom caul plate 20, and a fixture 22 having an opening therein for placement of a material stack 24. As previously stated, the material stack 24 may comprise a high number of liquid crystalline polymer insulating layers each having patterned circuits in the attached foil features. In addition, a liquid crystalline polymer adhesive layer may be placed between each of the liquid crystalline polymer layers to create the material stack which is then pressed and laminated to form a high layer multi-level circuit.

As shown in FIG. 1, material stack 24 is positioned within the opening of fixture 22, and extends in height above the height of fixture 22, prior to applying pressure to material stack 24. During lamination (when pressure is applied to the material stack 24 by press 12), fixture 22 functions to limit the lamination pressure. Limiting lamination pressure on material stack 24 with fixture 22 during lamination provides a uniform pressure which in turn provides a laminated package having a uniform thickness and minimal shifting of features on the various layers comprising the material stack. FIG. 2 shows the apparatus of the present invention and material stack 24 after applying uniform pressure to material stack 24 using fixture 22. Material stack 24 is now a laminated package having a thickness or height equal to or less than the thickness or height of fixture 22.

Lamination of the material stack is done by bonding the layers of the material stack with heat and pressure. It should be noted that platens 14 and 16 also provide a heat source for elevating the temperature of the layers in the material stack. When using liquid crystalline polymer layers in material stack 24, lamination temperatures and pressures are selected to bond the layers together and the temperature used is less than the temperature at which the liquid crystalline polymer layers and any conductive layer (such as copper) deteriorate. Lamination may be performed with heated rolls or presses, used in combination with the fixture, to bond the layers in the material stack.

Figure 3:
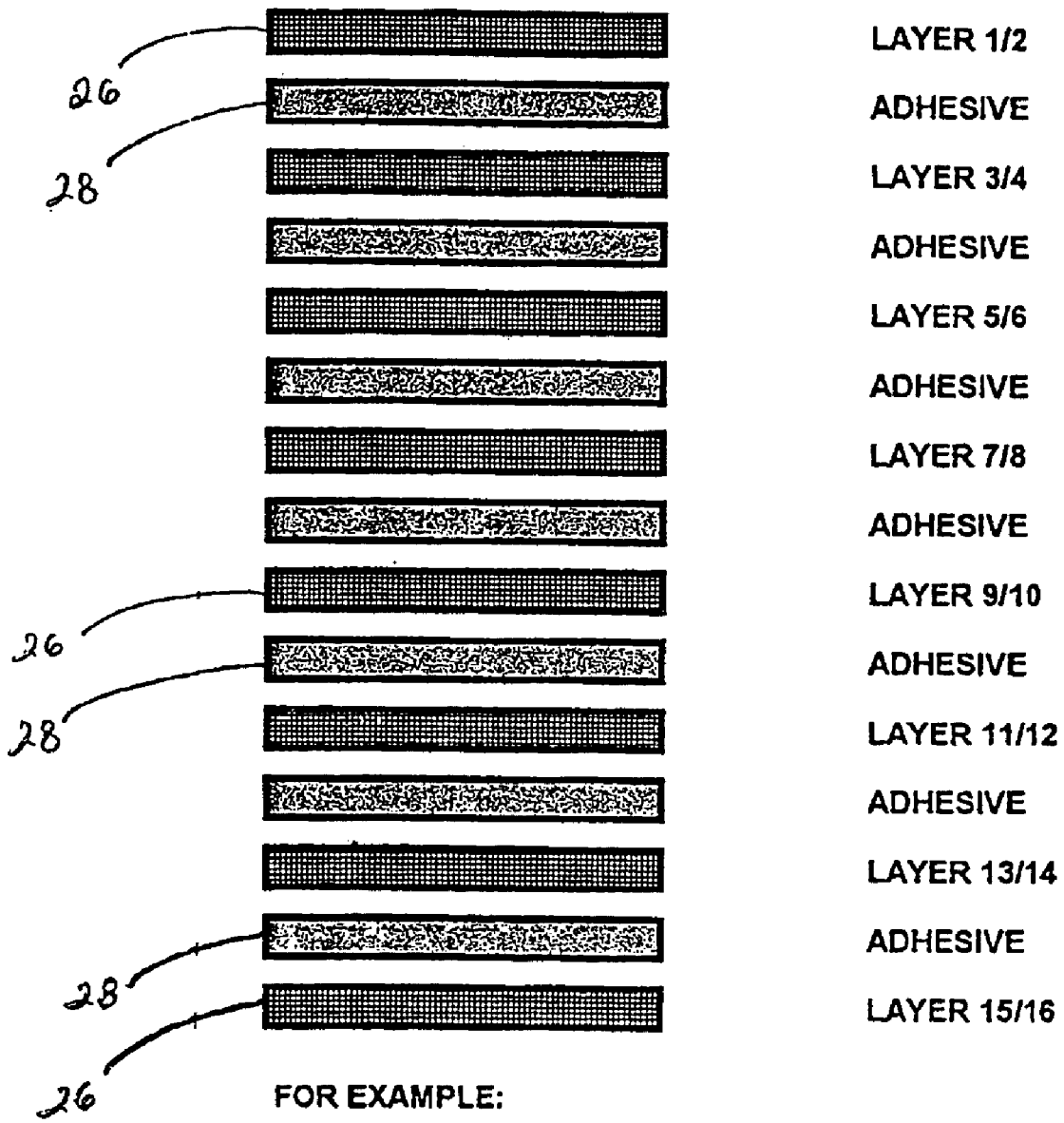
FIG. 3 is an exploded view of an exemplary embodiment of a material stack prior to loading it into the opening of the fixture.

Turning now to FIG. 3, an exploded view of an exemplary embodiment of a material stack is shown prior to loading it into the opening of fixture 22. The material stack shown in FIG. 3 includes alternating layers of liquid crystalline polymer 26 and adhesive 28. In one exemplary embodiment of the invention, the fixture thickness is 0.097 inches. When using a sixteen layer stack having a thickness of about 0.992 inches like that depicted in FIG. 3, the laminated package that is produced from applying pressure to the material stack contained within the fixture results in a package having a uniform thickness of about 0.0376 inches.

Figure 4:
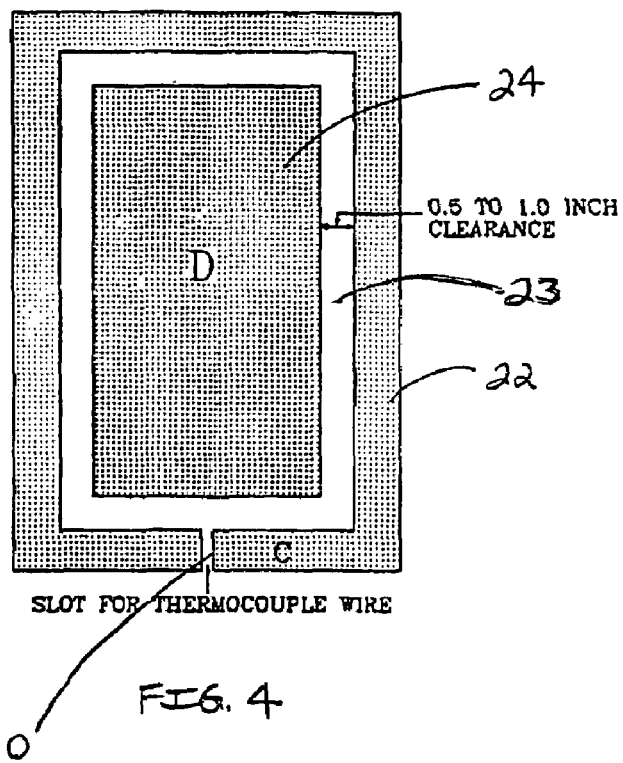
FIG. 4 is a top plan view of the material stack positioned within the opening of the fixture prior to applying pressure to the material stack.

FIG. 4 shows a top plan view of material stack 24 positioned within the opening of fixture 22 prior to applying pressure to material stack 24. Fixture 22 includes an opening 23 and is preferably made of a metal material other than aluminum, and more preferably a hard metal material such as stainless teel, copper, titanium, or any other metal material that can withstand a temperature of 550° F. In the exemplary embodiment of fixture 22 shown in FIG. 4, fixture 22 comprises a rectangular shape having opening 23 with a slot 30 connecting opening 23 with the exterior of fixture 22. Slot 30 is for receiving and retaining a thermocouple wire from a thermocouple which is used to attach the thermocouple to a material stack 24 contained within opening 23 of fixture 22. In the exemplary embodiment shown in FIG. 4, there is a clearance of 0.5 to 1.0 inches between the fixture 22 and the material stack 24.

Figure 5:
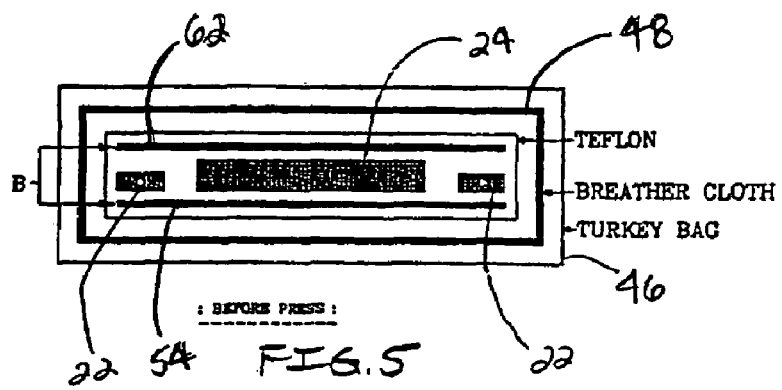
FIG. 5 is a cross-sectional view of the apparatus of the present invention before applying pressure to the material stack.
Figure 6:
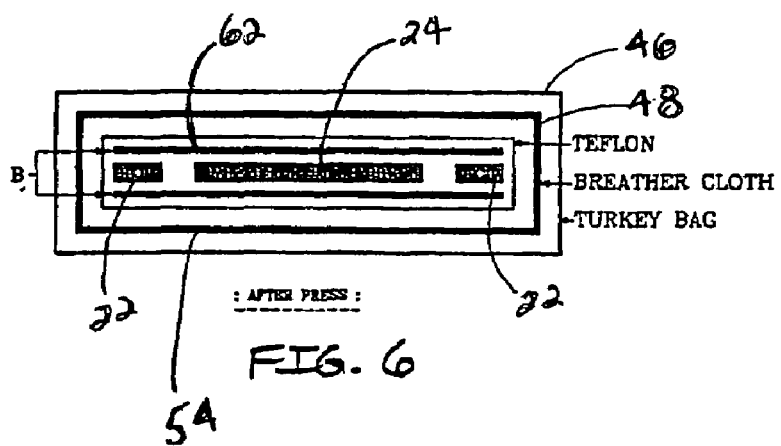
FIG. 6 is a cross-sectional view of the apparatus of the present invention after applying pressure to the material stack.

FIGS. 5 and 6 show cross-sectional views of the fixture 22 and material stack 24 after being prepared for the application of heat and pressure. These figures will be discussed in more detail after describing the stack material preparation and lay-up with the fixture and the bagging of the prepared stack materials, both of which are carried out prior to lamination of the material stack.

A cross-sectional schematic showing an exemplary embodiment of a portion of the apparatus of the present invention is shown in FIG. 7. A product stack is stacked for lamination by first placing a second bottom caul plate 36 (i.e. a different caul plate than that described with reference to FIG. 1) on the lay up surface (the surface which is being used to prepare the stack). A first bottom separator plate 38 is then placed on top of the second bottom caul plate 36. The fixture 22 (See FIG. 1) is then placed on the first bottom separator plate 38 and a few pins are inserted into the fixture, second bottom caul plate 36, and first bottom separator plate 38 to hold the fixture in place. The product layers are then positioned within the opening 23 of the fixture 22 (See FIG. 4). The lamination book 40 shown in FIG. 7 includes the fixture and the product layers. The product layers may be liquid crystalline polymer layers which may alternate with adhesive layers as shown in FIG. 3. A thermocouple wire 39 is then installed close to the middle of the product layers (See FIG. 8) and attached with Kapton tape. High temperature thermocouple wire is used and it is not placed near any part of the circuitry of the board. A second top caul plate 42 is then placed over the product layers and a first bottom separator plate 44 is then placed on the second top caul plate 42. Any remaining tooling pins are then installed to ensure that the fixture, second top and bottom caul plates 42 and 38, and first top and bottom separator plates 36 and 44 are seated in place. Second top and bottom caul plates 42 and 38 and first top and bottom separator plates 44 and 36 are preferably comprised of any strong metal material that can withstand temperature of 550° F. and be able to maintain its shape and form.

Next, the stack material prepared and set up in accordance with the preceding paragraph is placed in a vacuum enclosure. First, a bagging material 46 and a breather material 48 are cut such that they are approximately six inches wider than the second top and bottom caul plates 42 and 38 and the first top and bottom separator plates 44 and 36. In one exemplary embodiment, the bagging material 46 and breather material 48 for a twelve inch by eighteen inch stack should be eighteen inches wide and forty-two inches long. A skived Teflon release sheet 50 is cut three inches larger than the second top and bottom caul plates 42 and 38 and the first top and bottom separator plates 44 and 36. In one exemplary embodiment, the skived Teflon release sheet 50 should be cut to fifteen inches by twenty-one inches where the second top and bottom caul plates 42 and 38 and the first top and bottom separator plates 44 and 36 are twelve inches by eighteen inches.

The skived Teflon release sheet 50 is placed on a second bottom separator plate 52 and the bagging material 46 is placed on the skived Teflon release sheet 50. Breather material 48 is placed on bagging material 46 and a second skived Teflon release sheet 54 is placed on the breather material 48. A sealant tape 56 (See FIG. 8) is applied to the bagging material 46 near the edge of the bagging material 46 and under the thermocouple wire 39. The sealant tape 56 is wrapped around the thermocouple wire 39 aligning the sealant tape 56 with the sealant tape 56 on the edge of the bagging material 46. Sealant tape 56 is then wrapped around a copper tubing 58 approximately four inches from the end of a quick disconnect 60 (See FIG. 8). The copper tubing 58 is positioned along side of the lamination book 40 aligning sealant tape 56 on the edge of the bagging material 46 with the sealant tape 56 wrapped around the copper tubing 58.

The third skived Teflon release sheet 62 is placed on top of first top separator plate 44 and the flaps of the breather material 48 and bagging material 46 are then folded over the lamination book 40 and the third skived Teflon release sheet 62. The bagging material 46 is then aligned evenly and sealant tape 56 is used to close the bag. A fourth skived Teflon release sheet 64 is placed over the top of the bag and a second top separator plate 66 is placed over the fourth skived Teflon release sheet 64. The entire prepared, stacked, and bagged assembly as described in the preceding paragraphs is then loaded into the press 12 between top and bottom caul plates 18 and 20 and top and bottom platens 14 and 16 shown in FIG. 1. A vacuum is applied to the sealed bag containing the material stack before applying the press.

Returning to FIGS. 5 and 6, the material stack 24 is shown having a thickness greater than the fixture 22 prior to lamination in FIG. 5 and in FIG. 6 the material stack 24 has a thickness equal to or less than the fixture 22 after lamination.

Figure 9:
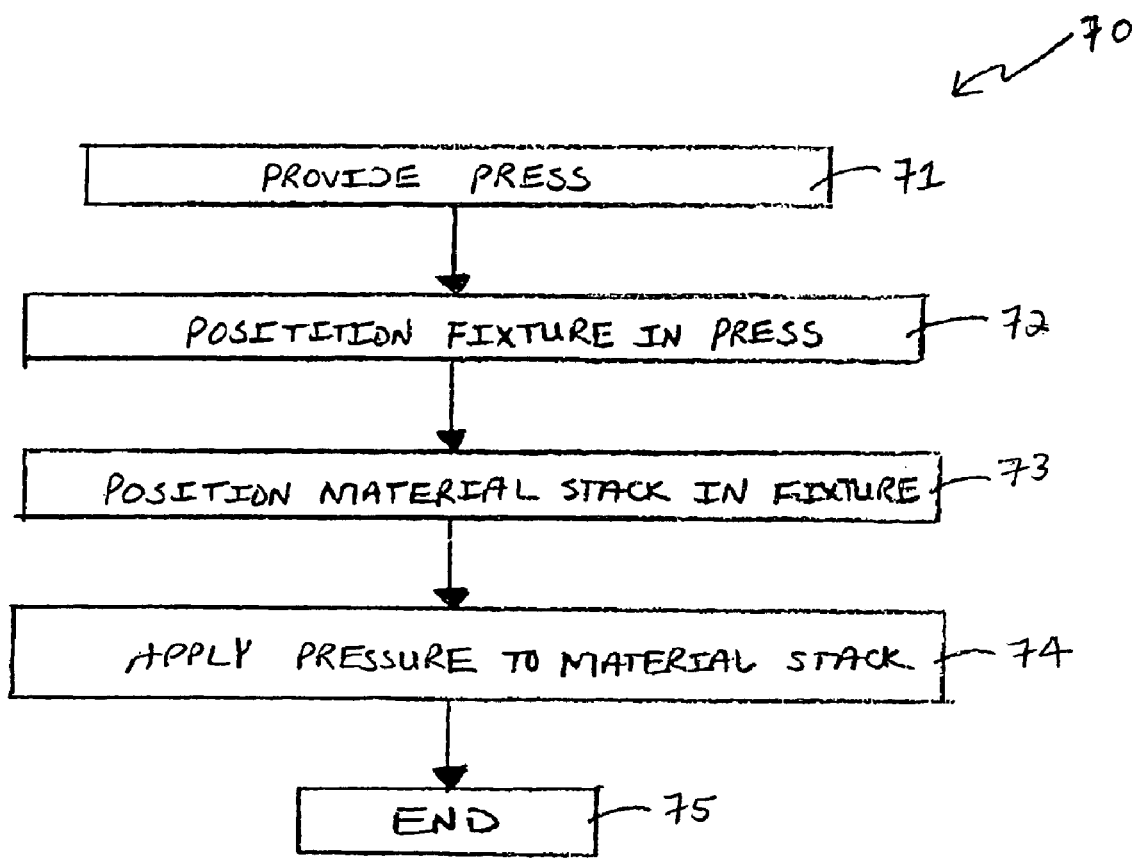
FIG. 9 is a flowchart depicting an exemplary embodiment of the method of the present invention for forming multi-layered circuits.

Turning now to FIG. 9, a flowchart 70 is shown which depicts an exemplary embodiment of the method of the present invention for forming high count multi-layered circuits. In step 71, a press or at least one roller is provided which is capable of applying pressure and heat to a material stack. Next, in step 72, a fixture having an opening is positioned within the press or under a roller and in step 73 a material stack is placed within the opening in the fixture. Pressure is applied to the material stack in step 74 to laminate the material stack and the process ends in step 75. Heat may also be applied along with applying the pressure.

Figure 10:
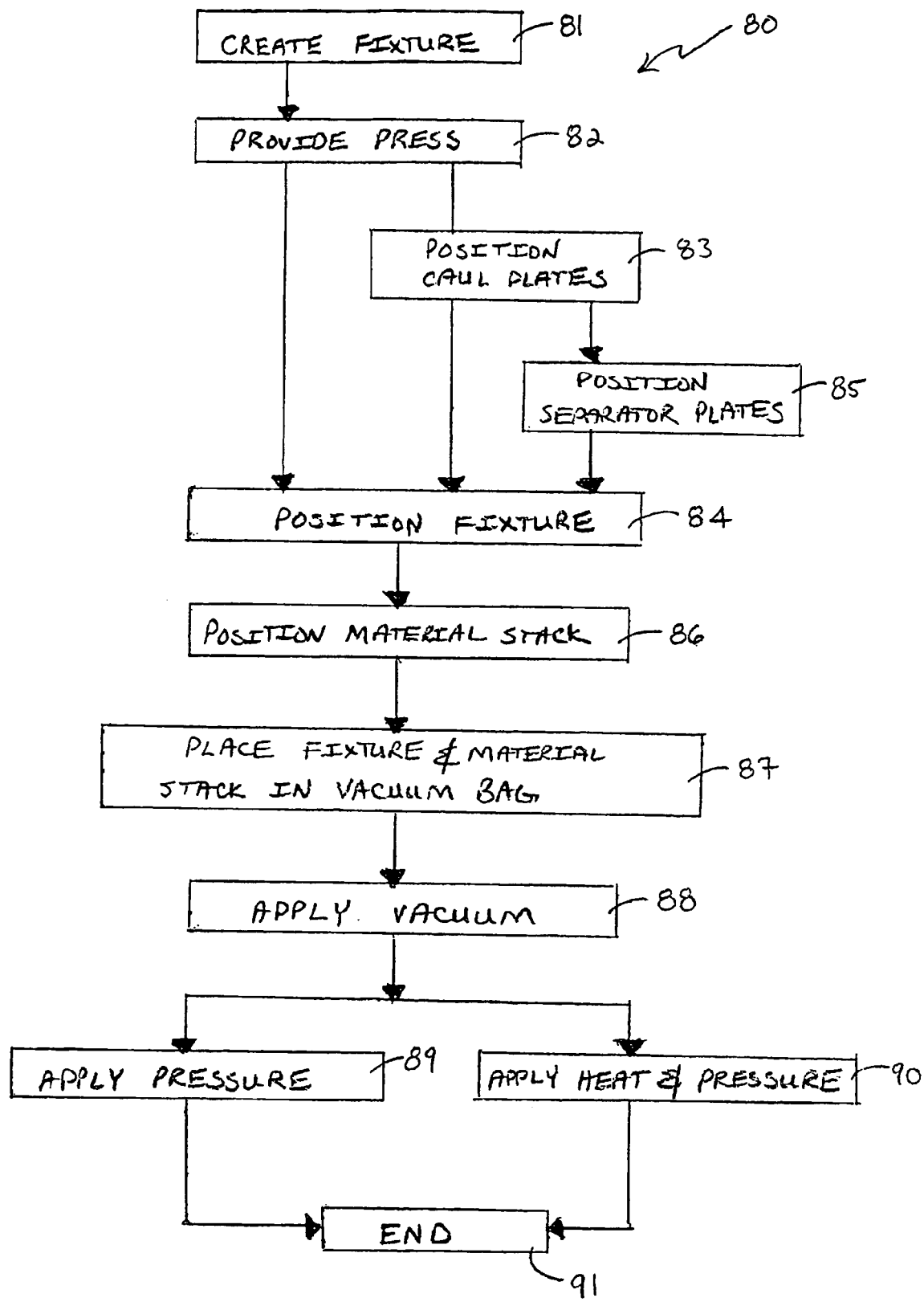
FIG. 10 is a flowchart depicting another exemplary embodiment of the method of the present invention for forming multi-layered circuits.

FIG. 10 is a flow chart 80 depicting another exemplary embodiment of the method of the present invention for forming high count multi-layered circuits. In step 81, a fixture is created having an opening therein in which to place a material stack. In step 82, a press is provided for applying pressure and heat to the material stack and in step 84 the fixture created in step 81 is positioned within the press. Optional steps 83 and 85 may also occur in which a pair of caul plates (step 83) and separator plates (step 85) are placed between platens in the press and the fixture is then positioned between the separator plates of the press in step 84. In step 86, a material stack is positioned within the opening contained within the fixture. Next, in step 87, the fixture and the material stack are placed in a vacuum bag and a vacuum is applied in step 88. Pressure is then applied in step 89 or, alternatively, heat and pressure are applied in step 90 in order to laminate the material stack. The process then ends in step 91.

Figure 11:
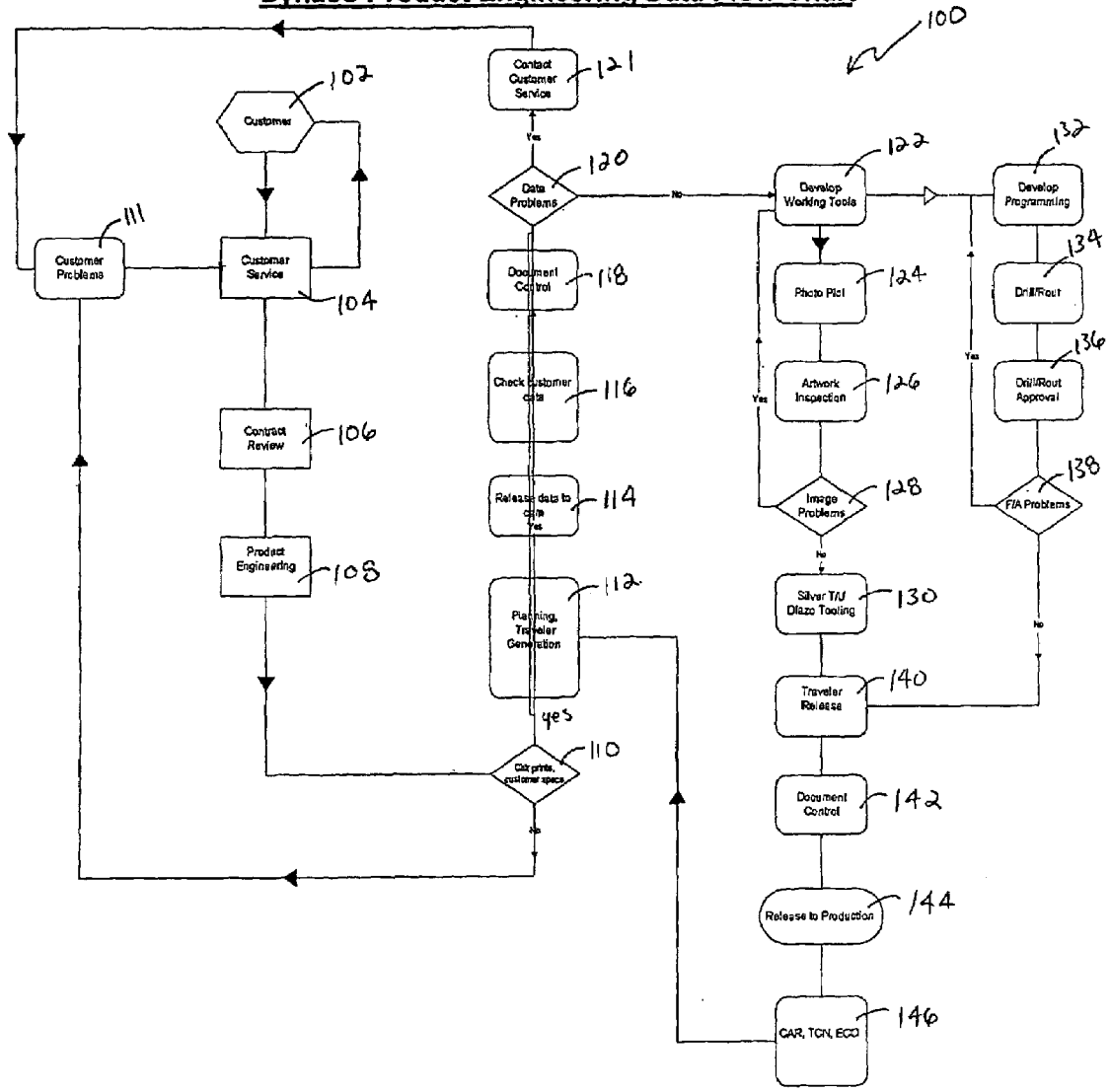
FIG. 11 is a flowchart depicting an exemplary method for custom creating the fixture of the present invention.

Turning now to FIG. 11, a flow chart 100 is shown which depicts an exemplary method for custom creating a fixture in accordance with the present invention. In step 102, the customer presents their specifications for a high count multi-layer circuit and customer service takes in those specifications in step 104. In step 106, a contract is reviewed in which the customers specs are contained and product engineering begins in step 108 to meet product specifications communicated by the customer. Prints and customer specs are again checked in step 110. If the prints and customer specs are not okay, these problems are discussed with the customer in step 111. After customer problems are discussed in step 111, results of those discussions are then forwarded to customer service in step 104 to begin the process once again. If, in step 110, the prints and customer specs are acceptable, then further planning and generation of traveler documents (reference documents) are created in step 112. Data is then released to the cam in step 114 and the customer data is checked in step 116. Document control takes place in step 118 and an inquiry as to the acceptability of the data is undertaken in step 120. If there are data problems, customer service is contacted in step 121 and problems are again discussed with the customer in step 111. If no data problems are present in step 120, working tools are developed in step 122. As part of that process, a photo plot is undertaken in step 124 and an artwork inspection is performed in step 126. Image problems are encountered in step 128 and, if there are image problems, there is a return to step 122 in which work tools are again developed. If no image problems exist in step 128, silver T/U diazo tooling occurs in step 130 and a traveler document (reference document) is released in step 140. Alternatively, working tools are developed by first developing programming in step 132, drilling and routing in step 134, obtaining drilling/routing approval in step 136, and then inquiring as to whether there are any first article problems in step 138. If there are first article problems in step 138, there is a return to step 132 to redevelop programming. If there are no first article problems in step 138, a traveler document (reference document) is released in step 140. After the traveler document is released in step 140, document control is performed in step 142 and the document is released to production in step 144. If problems or changes occur during production, traveler change notices and other standard operating procedures may be created in step 146 before further planning and generation of a traveler document (reference document) is generated in step 112.

Figure 12:
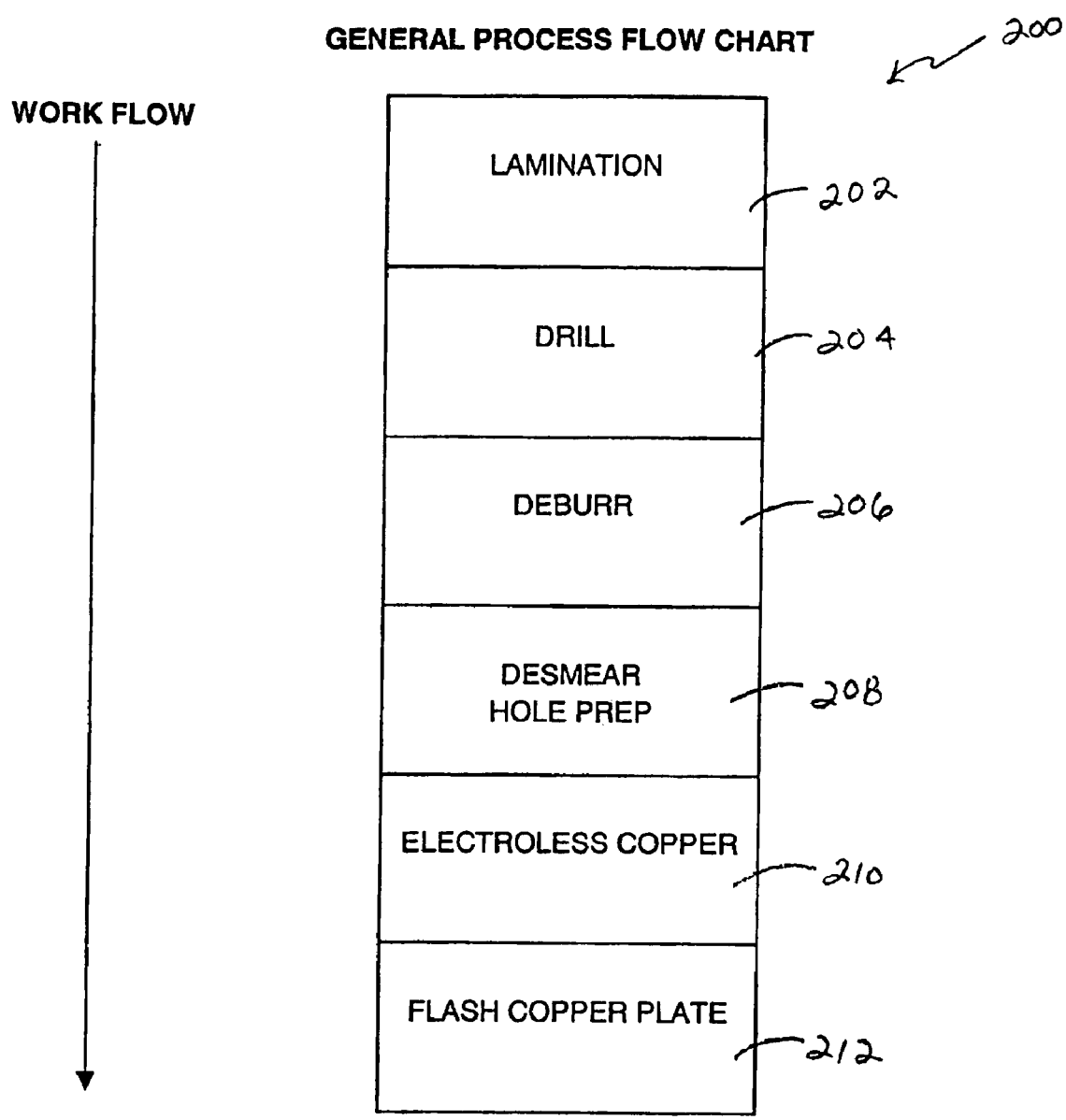
FIG. 12 is a flowchart depicting an exemplary process for completing the production of a multi-layered circuit in accordance with the present invention.
Figure 13:
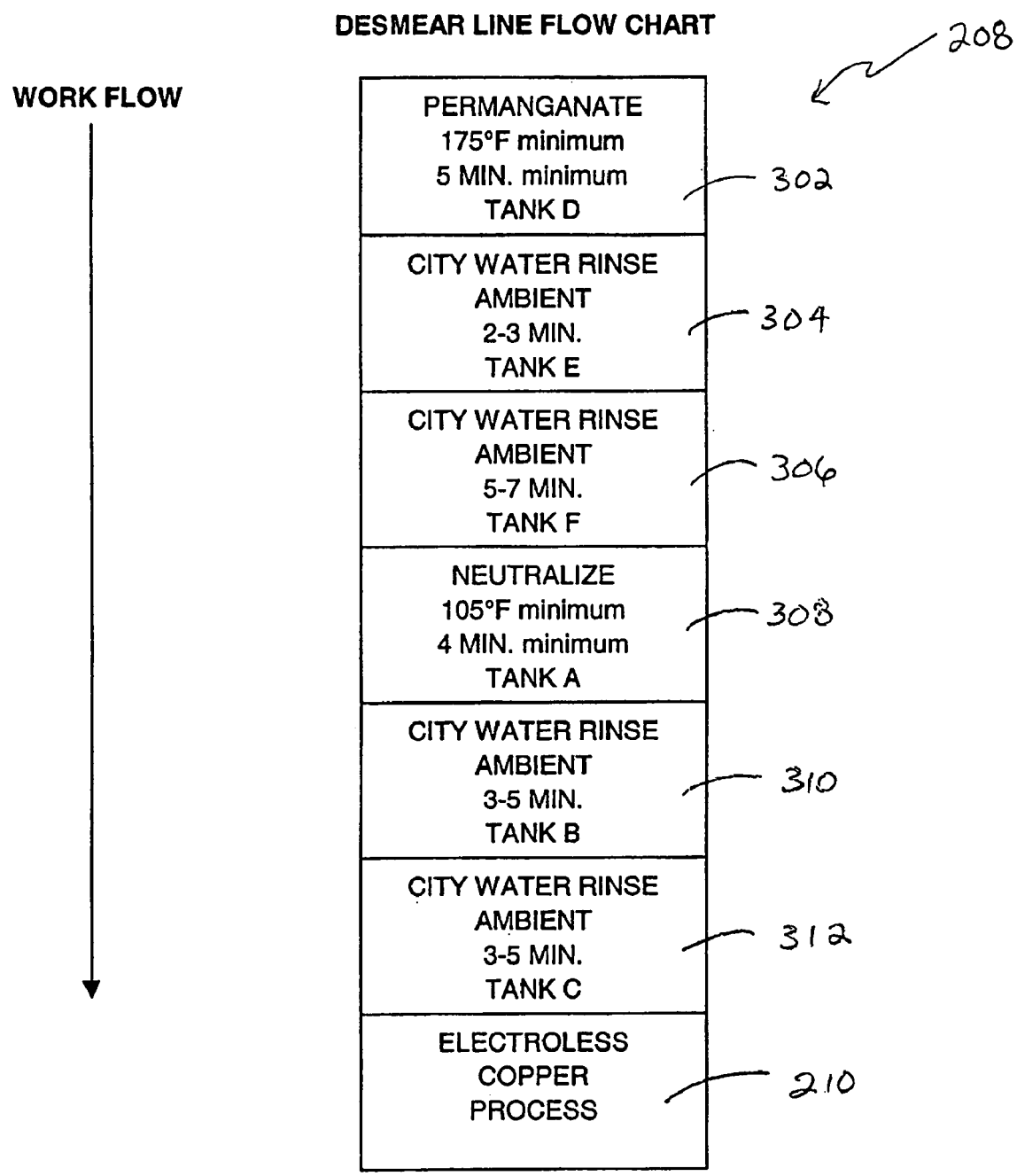
FIG. 13 is a flowchart depicting an exemplary process for desmear via preparation in accordance with the present invention prior to plating the inside of the vias.

FIG. 12 is a flow chart 200 depicting an exemplary process for completing the production of a high count multi-layered circuit in accordance with the present invention. After lamination in step 202, drilling takes place in step 204 and deburring takes place in step 206. Desmear hole prep takes place in step 208, electroless copper is applied in step 210 and flash copper plating takes place in step 212. FIG. 13 is a flow chart 208 depicting an exemplary process for desmear via hole preparation in accordance with the present invention prior to plating the inside of the vias. In step 302, the laminated panel is dipped in a permanganate solution which comprises 55-65 grams per liter of potassium permanganate in a 5-7% sodium hydroxide solution. The panel is dipped for five minutes at a minimum of 175° F. In step 304 the panel undergoes a water rinse in ambient water temperature for approximately 2-3 minutes. In step 306, another water rinse is conducted at ambient water temperature for 5-7 minutes. The panel is then neutralized in step 308 in a neutralizer solution containing 9-11% neutralizer and 8-10% sulfuric acid. The panel is dipped in the neutralizer for approximately four minutes at a temperature of 105° F. The panel then undergoes a water rinse at ambient temperature for 3-5 minutes in step 310 and another water rinse at ambient water temperature for 3-5 minutes in step 312. After step 312, the electroless copper step 210 is conducted as previously described in relation to FIG. 12.

It will be understood that the foregoing description is of preferred exemplary embodiments of the invention and that the invention is not limited to the specific forms shown or described herein. Various modifications may be made in the design, arrangement, and type of elements disclosed herein, as well as the steps of making and using the invention without departing from the scope of the invention as expressed in the appended claims.

The invention claimed is:

1. An apparatus for forming multi-layered circuits comprising:
   a press having top and bottom platens capable of applying pressure to a material stack located between the plates;
   a fixture positioned between the platens having an opening therein in which to position the material stack;
   a top caul plate positioned between the top platen and the fixture and a bottom caul plate positioned between the bottom platen and the fixture;
   a top separator plate positioned between the top caul plate and the fixture and a bottom separator plate positioned between the bottom caul plate and the fixture;
   a vacuum enclosure positioned around the fixture and the material stack; and
   a breather material contained within the vacuum bag and positioned around the fixture and the material stack.

2. The apparatus of claim 1 further comprising a first release sheet positioned on top of the bottom separator plate.

3. The apparatus of claim 1 further comprising at least one pin inserted in the fixture to hold the fixture in place.

4. An apparatus for forming multi-layered circuits comprising:
   a press having top and bottom platens capable of applying pressure to a material stack located between the plates;
   a fixture positioned between the platens having an opening therein in which to position the material stack;
   a top separator plate positioned between the top caul plate and the fixture and a bottom separator plate positioned between the bottom caul plate and the fixture;
   a first release sheet positioned on top of the bottom separator plate; and
   a bagging material positioned on top of the first release sheet.

5. The apparatus of claim 4 further comprising a breather material positioned on top of the bagging material.

6. The apparatus of claim 5 further comprising a second release sheet positioned between the breather material and the fixture containing a material stack.

7. The apparatus of claim 6 further comprising a thermocouple inserted into the material stack.

8. The apparatus of claim 7 further comprising a length of sealant tape applied around at least half of a perimeter of the bagging material and underneath and around the thermocouple.

9. The apparatus of claim 8 further comprising sealant tape wrapped around a length of copper tubing positioned along the perimeter of the bagging material where the copper tubing is connected to a disconnect.

10. The apparatus of claim 9 further comprising a third release sheet positioned on top of the material stack.

11. The apparatus of claim 10 further comprising a vacuum enclosure contained around the breather material, the fixture, and the material stack, by folding the bagging material and applying pressure to the length of sealant tape to seal the bagging material.

12. The apparatus of claim 11 further comprising a vacuum connected to the vacuum enclosure.

* * * * *